(12) United States Patent
Komiyama

(10) Patent No.: US 11,754,597 B2
(45) Date of Patent: Sep. 12, 2023

(54) CLAMP SENSOR WITH A PAIR OF CLAMP ARMS AND ELECTRICAL PARAMETER MEASURING DEVICE

(71) Applicant: HIOKI E.E. CORPORATION, Nagano (JP)

(72) Inventor: Tetsuya Komiyama, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 0 days.

(21) Appl. No.: 17/725,864

(22) Filed: Apr. 21, 2022

(65) Prior Publication Data

US 2022/0341970 A1   Oct. 27, 2022

(30) Foreign Application Priority Data

Apr. 22, 2021 (JP) ................. 2021-072611

(51) Int. Cl.
*G01R 15/14* (2006.01)

(52) U.S. Cl.
CPC ................... *G01R 15/14* (2013.01)

(58) Field of Classification Search
CPC ...... G01R 1/0408; G01R 1/04; G01R 1/0416; G01R 31/52; G01R 31/50; G01R 31/58; G01R 19/0092; G01R 15/186; G01R 19/00; G01R 31/1272; G01R 31/54; G01R 31/36; G01R 19/0084; G01R 19/145; G01R 1/06788; G01R 31/282; G01R 31/3644; G01R 27/08; G01R 1/20; G01R 31/08; G01R 31/083; G01R 31/085; G01R 15/14; G01R 29/24; G01R 21/00; G01R 1/06; G01R 19/2503; G01R 33/07; G01R 33/1215; G01R 21/06; G06F 1/1607; G06F 11/2273; H03K 2017/9706

See application file for complete search history.

(56) References Cited

U.S. PATENT DOCUMENTS

| | | | | |
|---|---|---|---|---|
| 6,456,060 B1* | 9/2002 | Wiesemann | .............. | G01R 1/22 324/156 |
| 8,120,350 B2* | 2/2012 | Shah | .................. | G01R 1/22 324/126 |
| 8,570,026 B2* | 10/2013 | Liu | .................. | G01R 1/22 324/156 |
| 8,882,095 B2* | 11/2014 | Liu | .................. | G01R 1/22 269/3 |
| 9,400,289 B2* | 7/2016 | Komiyama | .............. | G01R 1/22 |
| 10,156,591 B2* | 12/2018 | Gopfert | .............. | G01R 1/06788 |

FOREIGN PATENT DOCUMENTS

JP    2004-125410    4/2004

* cited by examiner

*Primary Examiner* — Vinh P Nguyen
(74) *Attorney, Agent, or Firm* — Greenblum & Bernstein, P.L.C.

(57) ABSTRACT

A clamp sensor includes: a pair of clamp arms that construct a ring-shaped sensor in a closed state and rotate about a rotational shaft provided near base ends of the clamp arms so that other ends of the clamp arms come in to contact and move apart; and a pair of operating arms that extend from the base ends of the clamp arms and are capable, by rotating about the rotational shaft so as to approach each other, of shifting the clamp arms into an open state. The operating arms are formed in arc shapes where, when looking along an axial direction of the rotational shaft, an outer edge of one operating arm and an outer edge of the other operating arm are curved in a same direction.

20 Claims, 5 Drawing Sheets

CLAMP SENSOR WITH A PAIR OF CLAMP ARMS AND ELECTRICAL PARAMETER MEASURING DEVICE

FIELD OF THE INVENTION

The present invention relates to a clamp sensor equipped with a pair of clamp arms that form a ring-shaped sensor in a closed state where front ends of the clamp arms have been brought close together and configured so that the clamp arms are rotatable to have the front ends come in to contact and move apart, and also relates to a measuring device equipped with such a clamp sensor.

DESCRIPTION OF THE RELATED ART

As a known clamp sensor of this type, in Patent Literature 1 (Japanese Laid-open Patent Publication No. 2004-125410), the present applicant disclosed a clamp sensor equipped with a pair of clamp portions that can be freely opened and closed.

In the clamp sensor disclosed by the present applicant, base ends of both clamp portions are rotatably supported by a pair of support shafts inside an outer case (or "main body"), and both clamp portions are continuously biased by a coil spring to produce a state (or "closed state") where the front ends contact each other. This clamp sensor disclosed by the present applicant is also equipped with a pair of operating levers for shifting to a state (or "open state") where the front ends of both clamp portions are separated. Both operating levers of the clamp sensor are disposed on the left and right sides of the outer case (or "main body") and are rotatably supported by a pair of support shafts inside the outer case. The operating levers are configured so that it is possible to shift the clamp portions into the open state by causing the operating levers to rotate with respect to the outer case so that opposite ends of the operating levers (also referred to as the "operated ends") to the ends that are rotatably supported by the support shafts approach each other.

In addition, the clamp sensor disclosed by the present applicant is equipped with a locking mechanism for preventing the clamp portions that are in the closed state from unintentionally shifting to the open state. The locking mechanism of this clamp sensor is equipped with an operating piece, an opening preventing piece, and the like. With this locking mechanism, when an operation that slides the operating piece with respect to the outer case is performed, the opening preventing piece is caused to move between the base ends of the clamp portions in the closed state, so that rotation of both clamp portions (that is, a transition from the closed state to the open state) is restricted. In addition, when the operation piece is slid with respect to the outer case in the opposite direction, the opening preventing piece is withdrawn from between the base ends of both clamp portions, thereby permitting rotation of both clamp portions (that is, permitting a transition to the open state).

When using this clamp sensor, both clamp portions that have been placed in the closed state are shifted into the open state. When this transition to the open state is being restricted by the locking mechanism, a sliding operation of the operating piece is performed to withdraw the opening preventing piece from between both clamp portions, thereby releasing the restriction. After this, the operating levers are rotated with respect to the outer case so as to cause the operated ends to move closer to each other. When doing so, the base ends of both clamp portions are pressed by the operating levers, which results in both clamp portions being rotated against the biasing force of the coil spring and shifting to the open state. In this state, a clamped object (i.e., the conductor to be measured) is passed between the front ends of both clamp portions to become positioned between both clamp portions.

After this, the operating force applied to both operating levers is relaxed. As a result, both clamp portions are rotated by the biasing force of the coil spring, which places the clamp portions in the closed state. A sliding operation of the operating piece is then performed to move the opening preventing piece between both clamp portions. By doing so, rotation of both clamp portions becomes restricted by the locking mechanism (specifically, the opening preventing piece), resulting in a state where shifting from the closed state to the open state is restricted. With this configuration, even if the hand holding the clamp sensor touches both operation levers, both clamp portions will remain in the closed state. Next, a measured value for the clamped object is measured based on a signal that is detected via the clamp sensor. When a measurement operation has been completed, both clamp portions are placed in the open state and the clamp sensor is removed from the clamped object in the same way as the method of operation described above. This completes the series of tasks in a measurement operation.

SUMMARY OF THE INVENTION

However, the clamp sensor disclosed by the present applicant has the following problem to be solved.

In more detail, in the clamp sensor disclosed by the present applicant, both clamp portions are rotatably supported by separate support shafts inside the outer case and both operating levers are rotatably supported by separate support shafts inside the outer case. This means that with this clamp sensor, to enable both clamp portions to open and close, a pair of operating levers that are formed separately to both clamp portions and four support shafts that rotatably support both clamp portions and both operating levers are required. As a result, the clamp sensor has many component parts and the assembly process during manufacturing is complex. These factors make it difficult to reduce the manufacturing cost.

In addition, the clamp sensor disclosed by the present applicant is configured, as one example, so that it is possible to shift both clamp portions from the closed state to the open state by holding the clamp sensor in one hand with the thumb on one of the two operating levers and the index finger (or the index finger and middle finger) on the other operating lever and operating the two operating levers so as to bring the thumb and the index finger (or the index finger and middle finger) closer together. The clamp sensor is also configured so that when looking along the axial direction of the respective support shafts mentioned above, the outer edges of both operating levers (that is, the positions where the thumb and index finger (or the thumb, index finger, and middle finger) are placed) and the outer edges on the sides of the outer case (that is, the positions where the little finger, ring finger, and middle finger (or the little finger and ring finger), and also the ball of the thumb (or palm-end of the thumb) are placed) are formed so as to be straight.

On the clamp sensor disclosed by the present applicant, the surfaces of the outer edges of both operating levers and the outer edges on the sides of the outer case are provided with undulations to prevent slipping. However, depending on the size of the user's hand and/or the manner in which the user holds the clamp sensor, when force is applied to operate both operating levers, there is the risk of the user's thumb and index finger (or thumb, index finger, and middle finger) slipping on both operating levers and/or of the user's little finger, ring finger, and middle finger (or little finger and ring finger) and the ball of the thumb slipping on the outer case. This situation should preferably be improved.

The present invention was conceived in view of the problem to be solved described above, and has a principal object of providing a clamp sensor and a measuring device that can be manufactured at lower cost and can be held and subjected to opening and closing operations easily and reliably.

The clamp sensor according to the present invention comprises: a pair of clamp arms that are formed in arc shapes and construct a ring-shaped sensor in a closed state where front ends of the clamp arms contact each other, wherein the clamp arms are each rotatable about a rotational shaft provided in a vicinity of a base end of each clamp arm so that the front ends come in to contact and move apart; and a pair of operating arms that extend from the base ends of both clamp arms and are capable, by rotating about the rotational shaft so as to approach each other, of shifting both clamp arms into an open state where the front ends are separated, wherein both operating arms are formed in arc shapes where, when looking along an axial direction of the rotational shaft, a first outer edge on an opposite side of one operating arm out of the operating arms to another operating arm-side of the one operating arm and a second outer edge of the other operating arm on an opposite side to the one operating arm-side of the other operating arm are curved in a same direction.

Accordingly, with the clamp sensor and the measuring device according to the present invention, since it is possible to sufficiently reduce the number of components in the clamp sensor by integrally forming one clamp arm and one operating arm and integrally forming the other clamp arm and the other operating arm, it is possible to sufficiently reduce the manufacturing cost of the components and the assembly cost. As a result, it is possible to sufficiently reduce the manufacturing cost of the clamp sensor. In addition, since the first outer edge of the one operating arm and the second outer edge of the other operating arm are arc-shaped and curved in the same direction, when the clamp sensor is held with one hand (as one example, with all five fingers), it is possible to place the fingers on the first outer edge and the second outer edge with a natural posture. As a result, the clamp sensor can be held reliably and easily, which makes it possible to prevent the clamp sensor from being unintentionally dropped. Also, since the fingers are favorably prevented from slipping on the first outer edge and the second outer edge even when both operating arms are operated, it is possible to perform opening and closing operations of both clamp arms reliably and easily. In addition, when both operating arms have been brought close to each other to shift both clamp arms into the open state, the distance between the first outer edge and the second outer edge is sufficiently short across the entire length direction of both operating arms, which makes it possible to maintain the state where both operating arms are held close to each other (that is, the open state of both clamp arms) easily and reliably, even with a small hand. As a result, clamping of the clamped object (that is, the attachment of the clamp sensor to the clamped object) and removal of the clamp sensor from the clamped object can be performed reliably and easily. Since the distance between the first outer edge and the second outer edge is sufficiently short, it is possible to hold the clamp sensor securely and easily by pinching both operating arms between the thumb and the index finger (or between the thumb and the index finger and middle finger) and possible to open and close the clamp arms reliably and easily in this state. As a result, compared to the case where the clamp sensor is held with one hand by placing all five fingers on both operating arms, it is possible to hold and to open and close the clamp sensor in a variety of postures without forcibly bending and stretching the wrist or the elbow when clamping the clamped object or removing the clamp sensor from the clamped object. Accordingly, it is possible to easily and reliably attach and remove the clamp sensor even with a clamped object that is positioned in a tight location or a clamped object positioned at a high or a low location. Also, unlike a configuration where the first outer edge and the second outer edge are curved in opposite directions so that center portions in the length direction of both operating arms are widely separated or a configuration where the first outer edge and the second outer edge are straight along the length direction of both operating arms, since the first outer edge and the second outer edge are arc-shaped so as to be curved in the same direction, slipping on the operating arm where the fingers are placed on the inside of the arc shape is less likely, even when the clamp sensor is held with only two or three fingers. As a result, slipping on the operating arm where the fingers are placed on the outside of the arc shape is also less likely. This means that the clamp sensor can be reliably held with only two or three fingers, which makes it possible to favorably prevent the clamp sensor from being unintentionally dropped.

Also, with the clamp sensor according to the present invention, both operating arms are formed so that a first distance between the rotational shaft and an end of the one operating arm on an opposite side to a clamp arm-side of the one operating arm is shorter than a second distance between the rotational shaft and an end of the other operating arm on an opposite side to a clamp arm-side of the other operating arm.

Accordingly, with the clamp sensor and the measuring device according to the present invention, by forming both operating arms so that the first distance between the rotational shaft and the end of one operating arm on the opposite side to the clamp arm-side is shorter than the second distance between the rotational shaft and the end of the other operating arm on the opposite side to the clamp arm-side, it is possible, when holding the clamp sensor in one hand in a state where the index finger, the middle finger, the ring finger, and the little finger have been placed on the second outer edge of the other operating arm, to place the thumb at the end of the first outer edge of the one operating arm on the opposite side to the clamp arm-side with a natural posture. As a result, it is possible to perform opening and closing operations of both clamp arms even more reliably and easily.

Also, with the clamp sensor according to the present invention, both operating arms are formed in arc shapes where, when looking along the axial direction, the first edge and the second edge are curved in a direction from the one operating arm toward the other operating arm.

Accordingly, with the clamp sensor and the measuring device equipped with such a clamp sensor according to the present invention, when the clamp sensor is held with one hand, the thumb can be placed with a natural posture on the first outer edge of the one operating arm and the index finger, the middle finger, the ring finger and the little finger can be placed with a natural posture on the second outer edge of the other operating arm. As a result, it is possible to perform opening and closing operations of both clamp arms even more reliably and easily.

Also, with the clamp sensor according to the present invention, a connecting cable for connecting the clamp sensor to a periphery exits the end of the other operating arm on the opposite side to the clamp arm-side.

Accordingly, with the clamp sensor and the measuring device equipped with such a clamp sensor according to the present invention, by having the connecting cable for connecting the clamp sensor to the periphery exit from the end of the other operating arm on the opposite side to the clamp arm-side, unlike a configuration where the connecting cable exits the end of the one shorter operating arm on the opposite side to the clamp arm-side, the connecting cable that exits the end of the other longer operating arm on the opposite side to the clamp arm-side does not obstruct operations of both operating arms, which makes it possible to perform opening and closing operations of both clamp arms even more reliably and easily.

Also, with the clamp sensor according to the present invention, both operating arms are formed in arc shapes where, when looking along the axial direction, both a third outer edge on the other operating arm-side of the one operating arm and a fourth outer edge on the one operating arm-side of the other operating arm are curved in a same direction as the first outer edge and the second outer edge.

Accordingly, with the clamp sensor and the measuring device according to the present invention, by forming both operating arms so that when looking along the axial direction, both the third outer edge on the other operating arm-side of the one operating arm and the fourth outer edge on the one operating arm-side of the other operating arm have arc shapes that are curved in the same direction as the first outer edge and the second outer edge, it is possible to make the width between the first outer edge and the third outer edge sufficiently large across the entire length direction of the one operating arm, possible to make the width between the second outer edge and the fourth outer edge sufficiently large across the entire length direction of the other operating arm, and possible to provide the clamp sensor with superior aesthetics where all of the first outer edge, the second outer edge, the third outer edge, and the fourth outer edge are curved in the same direction.

Also, with the clamp sensor according to the present invention, both operating arms are formed so that when looking along the axial direction, a part of the third outer edge facing the fourth outer edge and a part of the fourth outer edge facing the third outer edge have a same shape.

Accordingly, with the clamp sensor and the measuring device equipped with such a clamp sensor according to the present invention, by forming both operating arms so that when looking along the axial direction, the part of the third outer edge that faces the fourth outer edge and the part of the fourth outer edge that faces the third outer edge have the same shape, when both operating arms have been operated in a direction that brings both operating arms closer to each other, a state is produced where both operating arms make contact over a sufficiently wide area of the third outer edge and the fourth outer edge. This means that even when an excessively strong force is applied, it is possible to favorably avoid breakage and deformation of the both operating arms and the rotational shaft.

BRIEF DESCRIPTION OF THE DRAWINGS

The present invention will be explained in more detail below with reference to the attached drawings, wherein.

DESCRIPTION OF THE PREFERRED EMBODIMENTS

Preferred embodiments of a clamp sensor and a measuring device will now be described with reference to the attached drawings.

Figure 1:
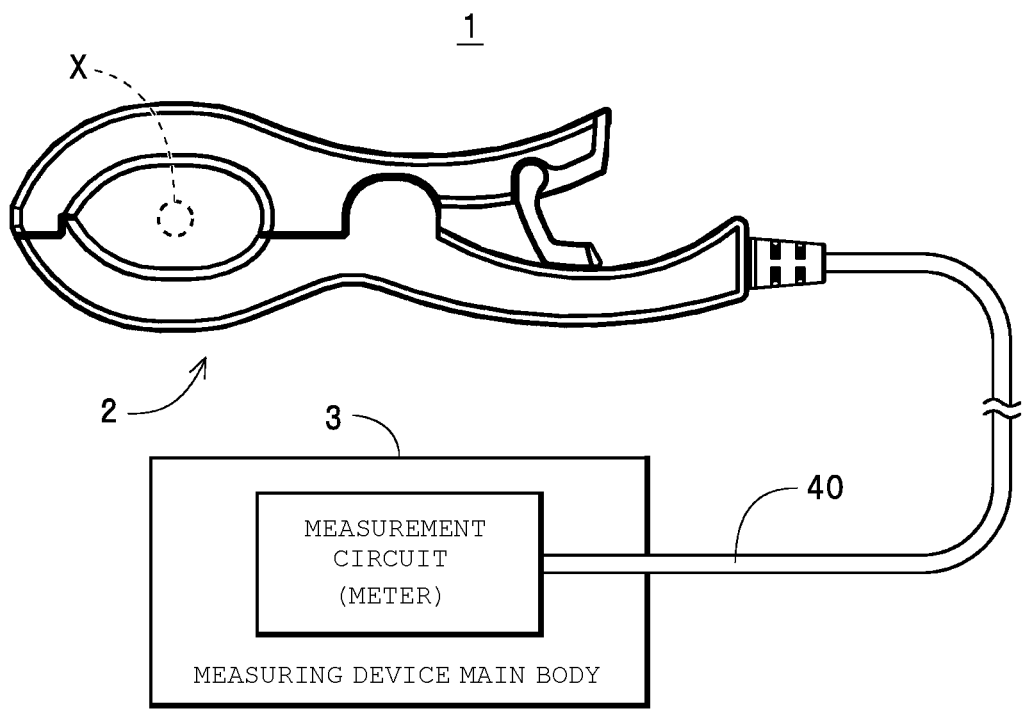
FIG. 1 is a diagram depicting the configuration of a measuring device when looking from the front.

A measuring device 1 depicted in FIG. 1 is a contactless current measuring device as one example of a "measuring device" according to the present invention, and is configured so as to be capable of detecting a magnetic field generated around a clamped object X (such as a wire) due to a current flowing in the clamped object X and measuring a current value (one example of a "measured value") of the current flowing in the clamped object X based on the magnitude of the detected magnetic field. In more detail, the measuring device 1 includes a clamp sensor 2 and a measuring device main body 3.

Figure 2:
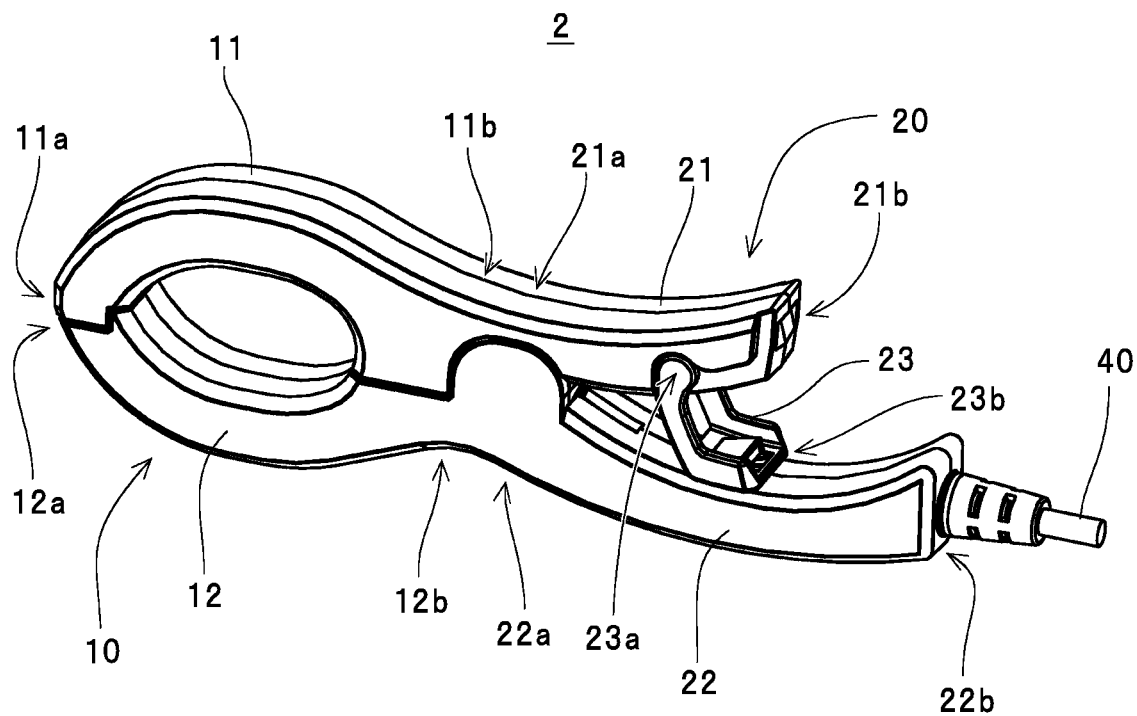
FIG. 2 is a perspective view depicting the external appearance of a clamp sensor in a state where shifting of a sensor to an open state is restricted.
Figure 3:
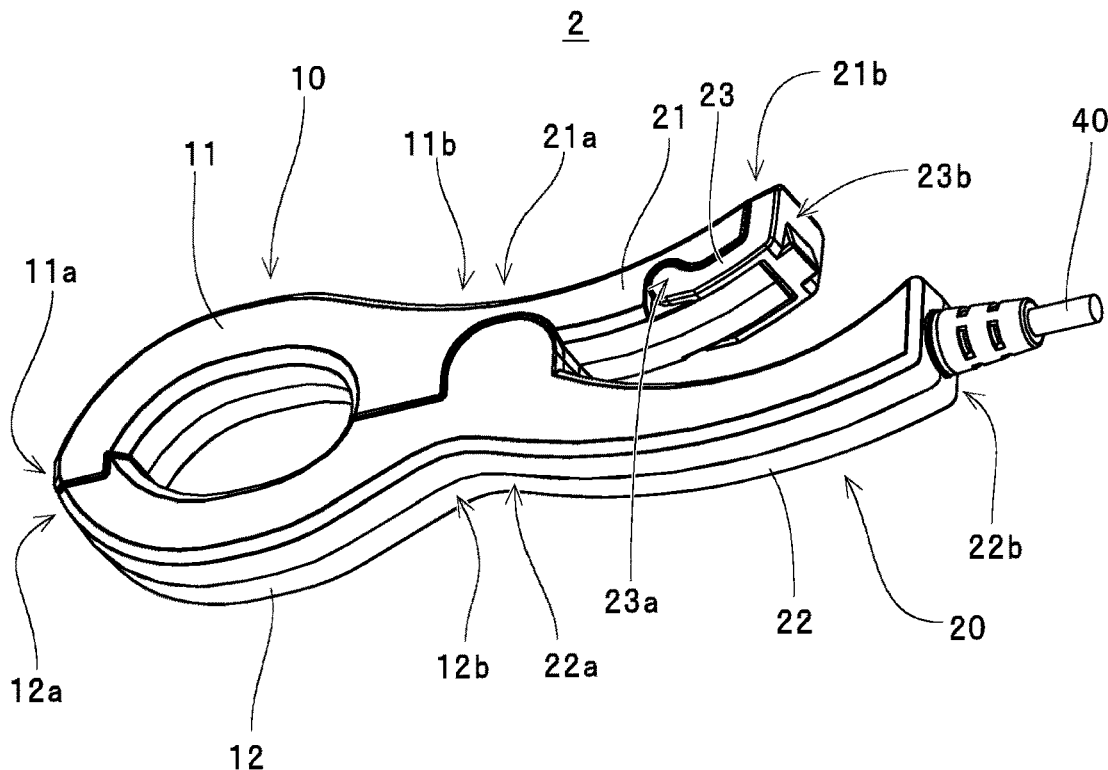
FIG. 3 is a perspective view depicting the external appearance of the clamp sensor in a state where shifting of the sensor to the open state is permitted.
Figure 4:
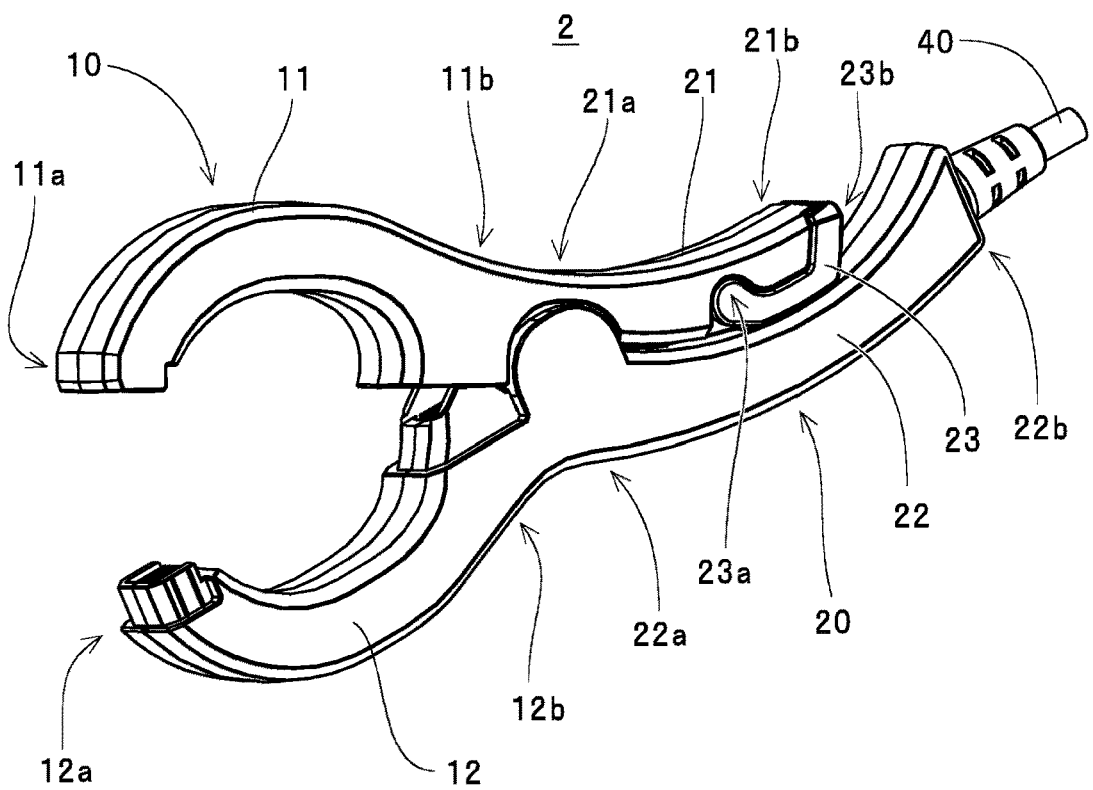
FIG. 4 is a perspective view depicting the external appearance of the clamp sensor in a state after the sensor has shifted to the open state.

The clamp sensor 2 is one example of a "clamp sensor" according to the present invention and, as depicted in FIGS. 2 to 4, includes a sensor 10, an operated portion 20, a rotational shaft 30 (see FIGS. 5 to 9), and a signal cable 40. The sensor 10 includes clamp arms 11 and 12 that are formed in arc shapes (one example of "a pair of clamp arms" for the present invention) and, as depicted in FIGS. 2 and 3, is configured so that a ring-shaped magnetism detection circuit (not illustrated) is formed in a closed state where ends 11a and 12a of the clamp arms 11 and 12 contact each other and ends 11b and 12b of the clamp arms 11 and 12 also contact each other. For the clamp sensor 2 according to the present embodiment, the ends 11a and 12a correspond to "front ends" for the present invention and the ends 11b and 12b correspond to "base ends" for the present invention.

The operated portion 20 includes an operating arm 21 provided so as to extend from the end 11b of the clamp arm 11 (that is, the operating arm 21 is integrally formed with the clamp arm 11) and an operating arm 22 provided so as to extend from the end 12b of the clamp arm 12 (that is, the operating arm 22 is integrally formed with the clamp arm 12) (one example of "a pair of operating arms" for the present invention). That is, in the clamp sensor 2 according to the present embodiment, a single rod-shaped member is constructed so that the end 11b of the clamp arm 11 and an end 21a of the operating arm 21 are continuous and another single rod-shaped member is constructed so that the end 12b of the clamp arm 12 and an end 22a of the operating arm 22 are continuous.

Figure 7:
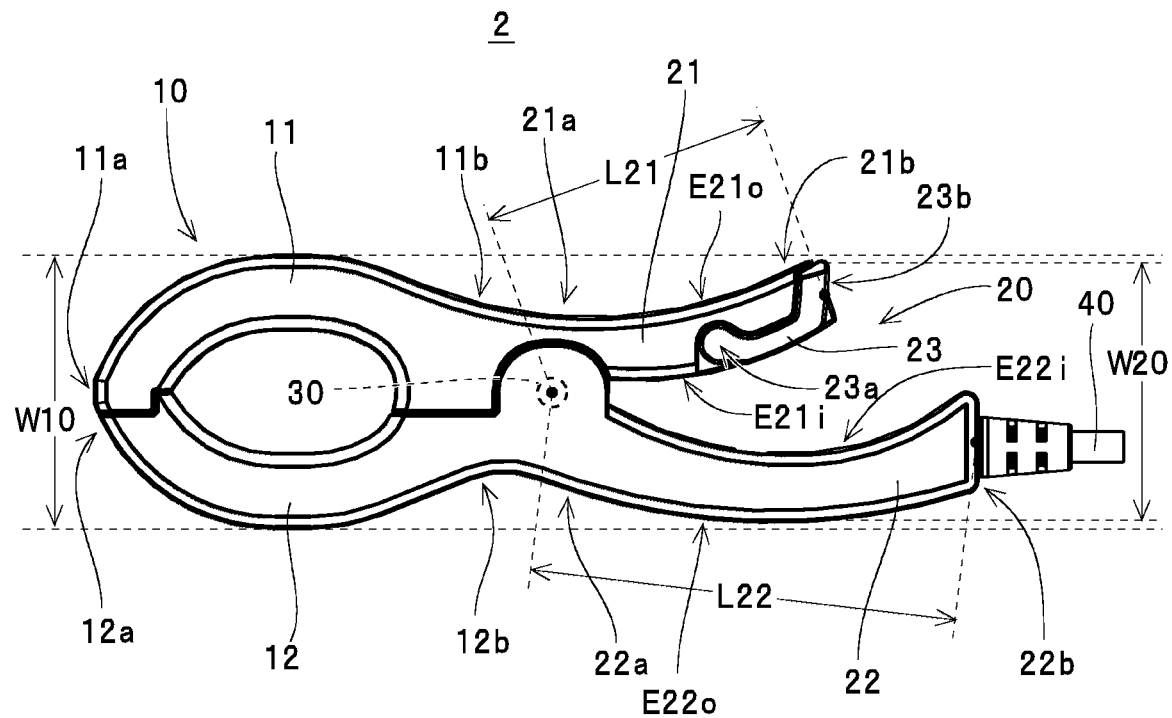
FIG. 7 is a view, when looking along an axial direction of a rotational shaft, depicting the external appearance of the clamp sensor in a state where shifting the sensor to the open state is permitted.
Figure 8:
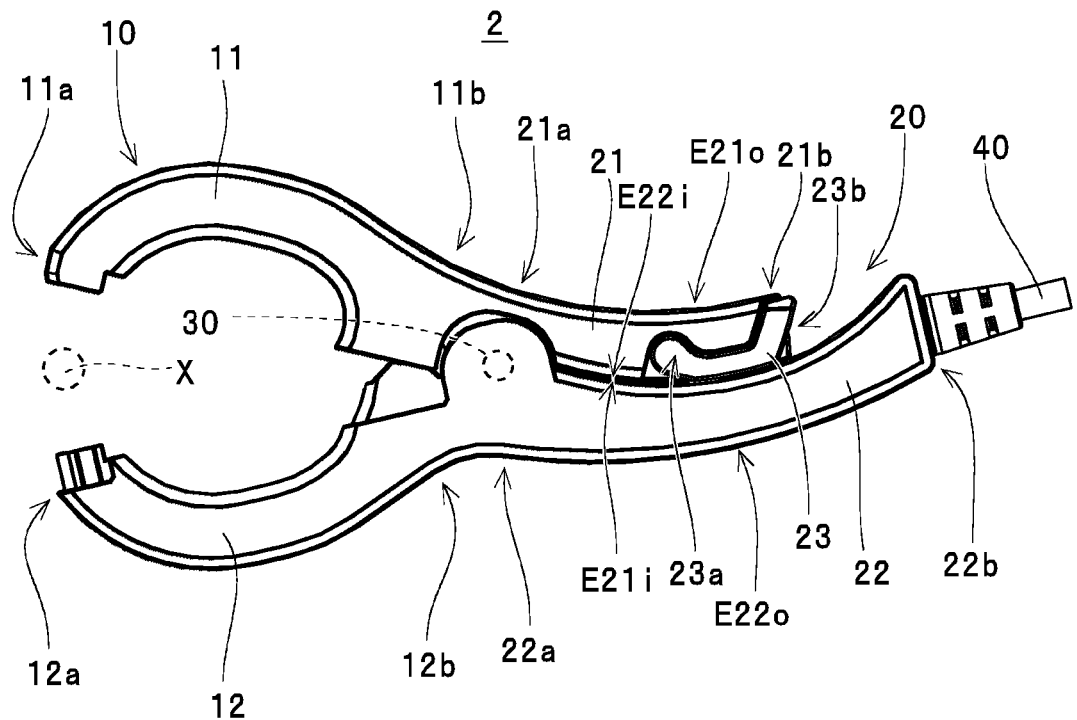
FIG. 8 is a view, when looking along the axial direction of the rotational shaft, depicting the external appearance of the clamp sensor in a state after the sensor has shifted to the open state.
Figure 9:
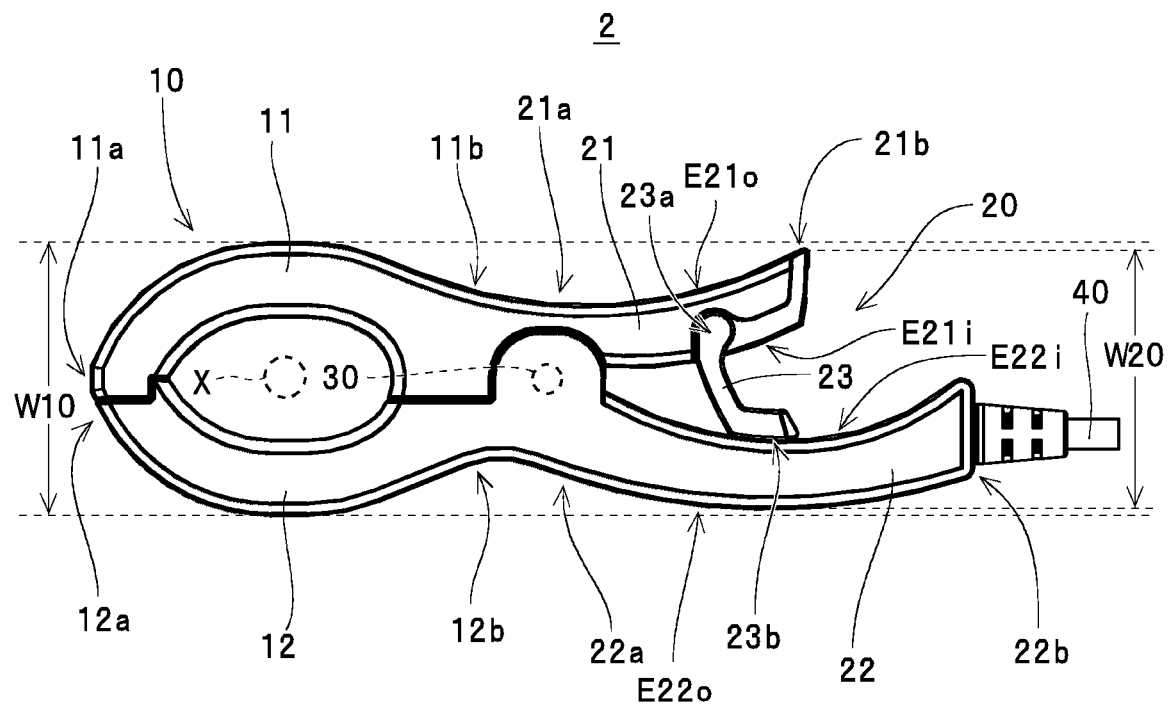
FIG. 9 is a view, when looking along the axial direction of the rotational shaft, depicting the external appearance of the clamp sensor in a state where shifting of the sensor to the open state is restricted.

Here, the clamp sensor 2 in the present embodiment is configured as depicted in FIGS. 7 to 9 so that both clamp arms 11 and 12 and the operating arms 21 and 22 can be rotated around a rotational shaft 30 (one example of a "rotational shaft" for the present invention) disposed at the end 21a of the operating arm 21 and the end 22a of the operating arm 22 (one example of "a vicinity of a base end of each clamp arm" for the present invention). The clamp sensor 2 is also configured as depicted in FIGS. 4 and 8 so that by rotating the operating arms 21 and 22 about the rotational shaft 30 so that the operating arms 21 and 22 (that is, an end 21b of the operating arm 21 and an end 22b of the operating arm 22) approach each other, it is possible to shift both clamp arms 11 and 12 to an open state where the ends 11a and 12a are separated from each other and the ends 11b and 12b are also separated from each other.

Note that for the clamp sensor 2 according to the present embodiment, the ends 21b and 22b correspond to "ends on an opposite side to a clamp arm-side" for the present invention. Note also that in an actual clamp sensor 2, a biasing member that biases both operating arms 21 and 22 in a direction where the operating arms 21 and 22 move apart from each other is housed inside the operating arms 21 and 22 and a sensor circuit board provided between the magnetism detection circuit of the sensor 10 and the signal cable 40 is housed inside the operating arm 22. However, for ease of understanding the configuration of the clamp sensor 2, illustration and detailed description of such components have been omitted.

Also, as depicted in FIG. 7, in the clamp sensor 2, both operating arms 21 and 22 are formed so that a distance L21 (one example of a "first distance" for the present invention) between the rotational shaft 30 and the end 21b of the operating arm 21 (one example of "one operating arm" for the present invention) is shorter than a distance L22 (one example of a "second distance" for the present invention) between the rotational shaft 30 and the end 22b of the operating arm 22 (one example of "another operating arm" for the present invention).

Here, as depicted in FIGS. 7 to 9, when the operating arms 21 and 22 of the clamp sensor 2 in the present embodiment are viewed along the axial direction of the rotational shaft 30, both an outer edge E21o of the operating arm 21 on an opposite side to the operating arm 22 side (one example of the "first outer edge" for the present invention) and an outer edge E22o of the operating arm 22 on an opposite side to the operating arm 21 side (one example of the "second outer edge" for the present invention) are formed so as to be arc-shaped and curved in the same direction. In more detail, when looking along the axial direction, the operating arms 21 and 22 are formed in arc shapes where the outer edges E21o and E22o are curved in a direction from the operating arm 21 toward the operating arm 22 (which is downward in FIGS. 7 to 9).

Here, in the clamp sensor 2 according to the present embodiment, the outer edge E22o of the operating arm 22 is curved with a gentle curvature corresponding to positions on an arc where the intermediate phalanxes of the four fingers composed of the index finger, the middle finger, the ring finger, and the little finger become positioned when an adult holds the clamp sensor 2 with one hand. The outer edge E21o of the operating arm 21 is gently curved with substantially the same shape (that is, substantially the same curvature) as the outer edge E22o of the operating arm 22.

For the operating arms 21 and 22 in the clamp sensor 2 according to the present embodiment, when looking along the axial direction, both an outer edge E21i (one example of the "third outer edge" for the present invention) on the operating arm 22 side of the operating arm 21 and the outer edge E22i (one example of the "fourth outer edge" for the present invention) on the operating arm 21 side of the operating arm 22 are formed in arc shapes that are curved in the same direction as the outer edge E21o of the operating arm 21 and the outer edge E22o of the operating arm 22 (in the present embodiment, a direction from the operating arm 21 toward the operating arm 22).

In addition, when looking along the axial direction, the operating arms 21 and 22 according to the present embodiment are configured so that the part of the outer edge E21i facing the outer edge E22i and the part of the outer edge E22i facing the outer edge E21i have the same shape, so that both clamp arms 11 and 12 have complementary shapes. As a result, with the clamp sensor 2 according to the present embodiment, as depicted in FIG. 8, during an operation where both clamp arms 11 and 12 are shifted into the open state (that is, when both operating arms 21 and 22 are brought close to each other), the outer edge E21i of the operating arm 21 and the outer edge E22i of the operating arm 22 make substantially tight contact with no gap produced between both operating arms 21 and 22.

Also, as depicted in FIGS. 2 to 4, in the clamp sensor 2 according to the present embodiment, a rotation restricting member 23 is attached to the operating arm 21. In more detail, as one example, the rotation restricting member 23 has an end 23a that is rotatably supported with respect to the operating arm 21 at an intermediate position between both ends 21a and 21b of the operating arm 21.

As depicted in FIGS. 7 and 8, in a state where the rotation restricting member 23 has been rotated with respect to the operating arm 21 so that the end 23b does not contact the operating arm 22 (the "unlocked state", as one example, a state where the end 23b has been rotated so as to be located at the end 21b side of the operating arm 21), the rotation restricting member 23 permits relative rotation of the operating arm 21 with respect to the operating arm 22 in a direction where the clamp arms 11 and 12 are shifted from the closed state to the open state.

Figure 5:
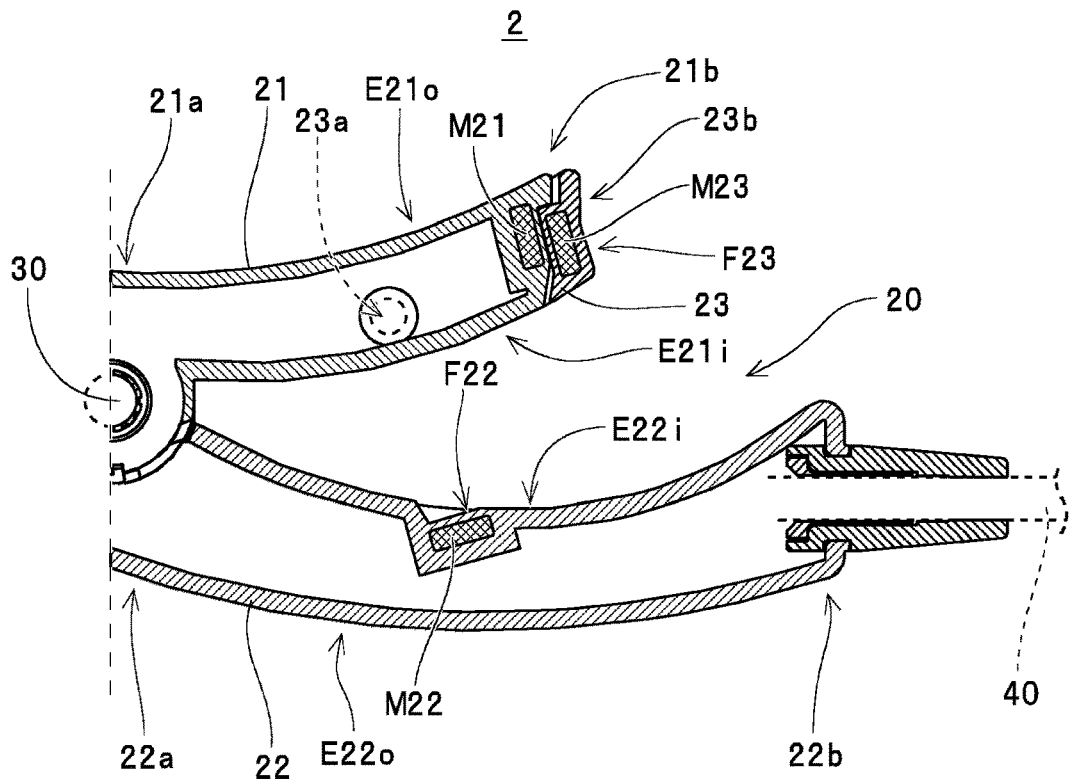
FIG. 5 is a cross-sectional view of an operated portion of the clamp sensor in a state where shifting of the sensor to the open state is permitted.

Here, in the clamp sensor 2 according to the present embodiment, the rotation restricting member 23 is rotatably supported on the operating arm 21 so that in the unlocked state, the end 23b is located at the end 21b of the operating arm 21. In the clamp sensor 2 according to the present embodiment, as depicted in FIG. 5, the position where the rotation restricting member 23 is rotationally supported on the operating arm 21, the length of the rotation restricting member 23, the shape of the rotation restricting member 23, and the like are set so as to produce a state where, in the unlocked state, the rotation restricting member 23 becomes integrated with the operating arm 21 to form a single rod and the rotation restricting member 23 is not located between the operating arms 21 and 22. By using this configuration, with the clamp sensor 2 according to the present embodiment, it is possible during an operation that shifts both clamp arms 11 and 12 into the open state to bring the outer edge E21i of the operating arm 21 and the outer edge E22i of the operating arm 22 sufficiently close together (that is, to place both outer edges E21*i* and E22*i* in close contact).

In addition, as depicted in FIG. 9, in a state where the rotation restricting member 23 has been rotated with respect to the operating arm 21 so that the end 23*b* contacts the outer edge E22*i* of the operating arm 22 (that is, the locked state), the rotation restricting member 23 restricts relative rotation of the operating arm 21 with respect to the operating arm 22 in the direction in which the clamp arms 11 and 12 are shifted from the closed state to the open state.

Figure 6:
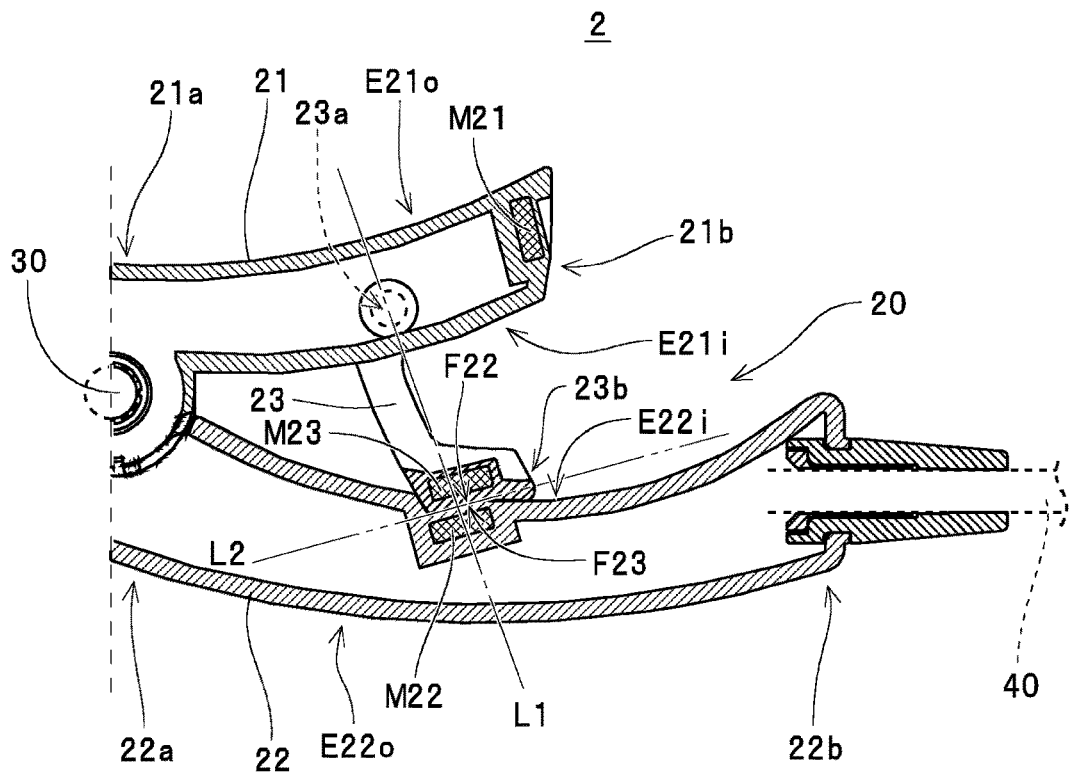
FIG. 6 is a cross-sectional view of the operated portion of the clamp sensor in a state where shifting of the sensor to the open state is restricted.

Here, in the clamp sensor 2 according to the present embodiment, as depicted in FIG. 6, when looking along the axial direction of the rotational shaft 30, the rotation restricting member 23 and the operating arm 22 are formed so that a virtual straight line (the dot-dash line L1 indicated in FIG. 6) that passes through both ends 23*a* and 23*b* of the rotation restricting member 23 in the locked state and a contact surface F22 of the operating arm 22 (that is, the surface along the dot-dot-dash line L2 indicated in FIG. 6) that is contacted by (a contact surface F23 of) the end 23*b* of the rotation restricting member 23 are perpendicular (or substantially perpendicular).

In the clamp sensor 2 according to the present embodiment, as depicted in FIG. 5, a magnet M21 is disposed at the end 21*b* of the operating arm 21 and a magnet M23 is disposed at the end 23*b* of the rotation restricting member 23. As a result, the clamp sensor 2 according to the present embodiment is configured so that when the rotation restricting member 23 is moved to the unlocked state, a state where the end 23*b* of the rotation restricting member 23 is pulled toward the end 21*b* of the operating arm 21 is maintained by the magnetic attraction between both magnets M21 and M23, so that rotation of the rotation restricting member 23 with respect to the operating arm 21 is restricted.

In the clamp sensor 2 according to the present embodiment, as depicted in FIG. 6, a magnet M22 is disposed at an intermediate position between both ends 22*a* and 22*b* of the operating arm 22. This means that the clamp sensor 2 according to the present embodiment is configured so that when the rotation restricting member 23 is shifted to the locked state, a state where the end 23*b* of the rotation restricting member 23 is pulled toward the outer edge E22*i* of the operating arm 22 is maintained by the magnetic attraction between this magnet M22 and the magnet M23 of the rotation restricting member 23, so that rotation of the rotation restricting member 23 with respect to the operating arm 21 (that is, releasing of the locked state) is restricted.

Also, with the clamp sensor 2 according to the present embodiment, as depicted in FIGS. 7 and 9, the respective lengths and shapes of both clamp arms 11 and 12 and/or both operating arms 21 and 22 are set so that the operated portion 20 is located within the range of the maximum width W10 of the sensor 10 in the closed state (that is, the maximum width W20 of the operated portion 20 is equal to or less than the maximum width W10 of the sensor 10).

Also, with the clamp sensor 2 according to the present embodiment, the signal cable 40 (one example of a "connecting cable" for the present invention) for connecting the clamp sensor 2 to the measuring device main body 3 is connected to the sensor circuit board described above inside the operating arm 22 and as depicted in FIGS. 2 to 4, the signal cable 40 exits to the periphery of the operating arm 22 from the end 22*b* of the operating arm 22. In addition, a connecting connector (not illustrated) for connecting to the measuring device main body 3 is connected to a front end of the signal cable 40.

On the other hand, as one example, the measuring device main body 3 is integrally constructed with component elements corresponding to the "periphery" and the "meter" for the present invention, in addition to an "operated portion" with a plurality of operation switches for setting measurement conditions and the like, a "display" for displaying measurement results, and the like. The measuring device main body 3 is configured so that the signal cable 40 of the clamp sensor 2 can be connected and disconnected. The measuring device main body 3 houses a measurement circuit connected via the signal cable 40 and the sensor circuit board described above to the sensor 10 (or " magnetism detection circuit") of the clamp sensor 2. Note that in place of this configuration of the measuring device main body 3, the component elements corresponding to the "periphery" and the "meter" may be constructed separately to the "operated portion", the "display", and the like.

With the measuring device 1, during storage or transportation, as one example, the clamp sensor 2 (that is, the signal cable 40) is removed from the measuring device main body 3 and the rotation restricting member 23 is moved to the locked state as depicted in FIGS. 2 and 9. By doing so, it becomes possible to store and transport the clamp sensor 2 in a slim state where the operated portion 20 is positioned within the range of the maximum width W10 of the sensor 10 in the closed state as described earlier. Also, by restricting unintended shifting of the sensor 10 to the open state, it is possible to favorably avoid situations where foreign matter becomes caught between the ends 11*a* and 12*b* of the clamp arms 11 and 12 so that the clamp arms 11 and 12 become deformed or damaged.

On the other hand, when measuring the current value of the current flowing through the clamped object X using this measuring device 1, first, the clamp sensor 2 (that is, the signal cable 40) is connected to the measuring device main body 3. Next, if the rotation restricting member 23 has been shifted to the locked state described above, the rotation restricting member 23 is rotated with respect to the operating arm 21 and moved to the unlocked state as depicted in FIGS. 3 and 7. By doing so, an operation that shifts both clamp arms 11 and 12 from the closed state to the open state is permitted.

Here, in the clamp sensor 2 according to the present embodiment, by rotating the rotation restricting member 23 with respect to the operating arm 21 until the end 23*b* of the rotation restricting member 23 becomes positioned at the end 21*b* of the operating arm 21, unintended rotation of the rotation restricting member 23 with respect to the operating arm 21 is restricted by the magnetic attraction between the magnet M21 disposed at the end 21*b* and the magnet M23 disposed at the end 23*b*. As a result, it is possible to avoid a situation where the rotation restricting member 23 in the unlocked state unintentionally rotates with respect to the operating arm 21 and hinders an operation, described later, that brings both operating arms 21 and 22 close to each other.

After this, as one example, the clamp sensor 2 is held in one hand with the palm placed on the operated portion 20 of the clamp sensor 2, with the index finger, the middle finger, the ring finger, and the little finger bent so that the intermediate phalanxes of the respective fingers are placed on the outer edge E22*o* of the operating arm 22, and with the thumb placed on the outer edge E21*o* of the operating arm 21. Next, the operating arm 21 is operated so that the thumb approaches the index finger. When doing so, the operating arm 21 rotates about the rotational shaft 30 against the biasing force of the biasing member (not illustrated), so that the operating arm 21 is brought closer to the operating arm 22. In addition, as the operating arm 21 rotates with respect to the operating arm 22, the clamp arm 11 that is integrally formed with the operating arm 21 is caused to rotate with respect to the clamp arm 12 that is integrally formed with the operating arm 22. By doing so, as depicted in FIGS. 4 and 8, the sensor 10 is shifted from the closed state to the open state, so that the end 11a of the clamp arm 11 and the end 12a of the clamp arm 12 become separated from each other, and the end 11b of the clamp arm 11 and the end 12b of the clamp arm 12 are separated from each other.

With the present configuration, in the clamp sensor 2 according to the present embodiment, the outer edge E22o of the operating arm 22 is curved with a gentle curvature in keeping with the positions on an arc where the intermediate phalanxes of the four fingers composed of the index finger, the middle finger, the ring finger, and the little finger are located. Accordingly, since it is possible for the force applied to the operating arm 22 when the operating arm 21 rotates with respect to the operating arm 22 (that is, the restorative force of the biasing member described above) to be received substantially evenly by the four fingers, it is possible for even a person with a weak grip to sufficiently support the operating arm 21 and favorably maintain the state where the four fingers are placed on the outer edge E22o of the operating arm 22 (that is, to favorably avoid the four fingers slipping on the operating arm 22).

With the clamp sensor 2 according to the present embodiment, the outer edge E21o of the operating arm 21 is gently curved in the same direction with substantially the same shape (that is, substantially the same curvature) as the outer edge E22o of the operating arm 22. Accordingly, since it is possible for the force applied to the operating arm 21 when the operating arm 21 rotates with respect to the operating arm 22 (that is, the restorative force of the biasing member described above) to be received substantially evenly across a sufficiently wide area at the thumb, it is possible to favorably support the operating arm 21 without experiencing pain at the thumb and possible to favorably maintain a state where the thumb is placed on the outer edge E21o of the operating arm 21 (that is, to favorably avoid the thumb slipping on the operating arm 21). Also, since the outer edges E21o and E22o are curved in the same way with the same orientation, when both operating arms 21 and 22 are brought close to each other, the distance between the outer edges E21o and E22o becomes sufficiently short across the entire length direction of the operating arms 21 and 22. This means that the state where both operating arms 21 and 22 have been brought close to each other can be reliably and easily maintained, even with a small hand.

In addition, as described earlier, the clamp sensor 2 is configured so that the part of the outer edge E21i of the operating arm 21 that faces the outer edge E22i of the operating arm 22 and the part of the outer edge E22i facing the outer edge E21i have the same shape, so that during an operation that places the sensor 10 into the open state, both outer edges E21i and E22i are placed in a state of substantially close contact with no gaps produced between the operating arms 21 and 22. Accordingly, even if an unnecessarily large force is applied in the direction where both operating arms 21 and 22 approach each other, a state is produced where there is contact between sufficiently wide regions of the outer edge E21i of the operating arm 21 and the outer edge E22i of the operating arm 22 so that the force applied to the contacting parts of the outer edge E21i and the outer edge E22i will be distributed, which makes it possible to favorably avoid breakage and deformation of the operating arms 21 and 22.

For a configuration where, unlike the clamp sensor 2 according to the present embodiment, the facing parts of the outer edges E21i and E22i have different shapes, that is, a configuration (not illustrated) where point contact is made by the outer edges E21i and E22i at a position in the length direction of the operating arms 21 and 22 when both operating arms 21 and 22 are brought close to each other, a force that attempts to pull off the parts of both operating arms 21 and 22 that are rotationally supported by the rotational shaft 30 will act with the parts of the outer edges E21i and E22i that make point contact as a pivot, resulting in the risk of deformation and/or breakage of the rotational shaft 30. On the other hand, with the clamp sensor 2 according to the present embodiment, the facing parts of the outer edges E21i and E22i have the same shape, so that when both operating arms 21 and 22 are brought close to each other, the outer edges E21i and E22i are placed in a state of making surface contact with each other without a part corresponding to the "pivot" described above being produced. This makes it possible to favorably avoid deformation and/or breakage of the rotational shaft 30.

Next, the clamped object X is passed between the ends 11a and 12a of both clamp arms 11 and 12 so as to become positioned between the clamp arms 11 and 12 (that is, the clamp sensor 2 is moved so that the clamped object X becomes positioned between the clamp arms 11 and 12). After this, the force applied by the thumb operating the operating arm 21 is relaxed.

When this happens, the operating arm 21 is rotated about the rotational shaft 30 by the biasing force of the biasing member (not illustrated) in the opposite direction to the operation described above that shifts to the open state, resulting in the operating arm 21 becoming separated from the operating arm 22. Also, together with this rotation of the operating arm 21 with respect to the operating arm 22 in the opposite direction, the clamp arm 11 that is integrally formed with the operating arm 21 is rotated with respect to the clamp arm 12 integrally formed with the operating arm 22 in the opposite direction to the operation described above that shifts to the open state. As a result, as depicted in FIGS. 3 and 7, the sensor 10 is shifted from the open state to the closed state, the end 11a of the clamp arm 11 and the end 12a of the clamp arm 12 will contact each other, the end 11b of the clamp arm 11 and the end 12b of the clamp arm 12 will contact each other, and a ring-shaped magnetism detection circuit is formed at the sensor 10.

After this, the rotation restricting member 23 is rotated with respect to the operating arm 21 so as to resist the magnetic attraction between the magnets M21 and M23 to shift to the locked state as depicted in FIGS. 2 and 9. In more detail, the rotation restricting member 23 is rotated with respect to the operating arm 21 so that the end 23b (that is, the contact surface F23) of the rotation restricting member 23 contacts the contact surface F22 on the outer edge E22i of the operating arm 22. As a result, operations in a direction where both operating arms 21 and 22 approach each other are restricted, which keeps the sensor 10 in the closed state. Here, with the clamp sensor 2 according to the present embodiment, the magnetic attraction between the magnet M22 disposed on the operating arm 22 and the magnet M23 disposed on the rotation restricting member 23 keeps the end 23b of the rotation restricting member 23 in contact with the outer edge E22i of the operating arm 22.

With the clamp sensor 2 according to the present embodiment, when the clamp sensor 2 is viewed along the axial direction of the rotational shaft 30 after the rotation restricting member 23 has been shifted to the locked state, a virtual straight line that passes through both ends 23a and 23b of the rotation restricting member 23 (that is, a virtual straight line along the direction in which the rotation restricting member 23 extends: the dot-dash line L1 indicated in FIG. 6) is perpendicular (or substantially perpendicular) to the contact surface F22 (the dot-dot-dash line L2 indicated in FIG. 6) of the operating arm 22 that is contacted by the end 23b of the rotation restricting member 23. As a result, since the contact surface F23 of the rotation restricting member 23 will be pressed perpendicularly (or substantially perpendicularly) onto the contact surface F22 of the operating arm 22 when a force is applied in a direction where both operating arms 21 and 22 become relatively closer to each other, it is less likely for the contact surface F23 to slip along the contact surface F22 (that is, for the end 23b to slip with respect to the operating arm 22). As a result, the state where the end 23b of the rotation restricting member 23 contacts the outer edge E22i of the operating arm 22 is more favorably maintained.

Accordingly, with the clamp sensor 2 according to the present embodiment, a situation where an operation is performed so that the rotation restricting member 23 that has been shifted to the locked state unintentionally rotates with respect to the operating arm 21 and both operating arms 21 and 22 approach each other is favorably avoided. This means that operations that shift both clamp arms 11 and 12 from the closed state into the open state are restricted, and the sensor 10 is maintained in the closed state. Through the series of operations described above, the clamping of the clamped object X by the clamp sensor 2 is completed.

After this, the operated portion of the measuring device main body 3 is operated to start the measurement process. When this happens, the magnetic field generated around the clamped object X due to the current flowing through the clamped object X (which is an electric wire or the like) is detected by the clamp sensor 2, with the measuring device main body 3 calculating (measuring) the current value of the current flowing through the clamped object X based on the magnitude of the detected magnetic field. As a result, a current value as the measurement result is displayed on the display of the measuring device main body 3, thereby completing the series of tasks in a measurement operation.

When the tasks in a measurement operation have been completed, the clamped object X is moved from between both clamp arms 11 and 12 (that is, the clamp sensor 2 is removed from the clamped object X) using the reverse procedure to the clamping operation described above. In addition, during transportation and storage, as described above, the rotation restricting member 23 is shifted to the locked state and the clamp sensor 2 is removed from the measuring device main body 3. By doing so, a series of operations is completed.

Note that with the clamp sensor 2 according to the present embodiment, in place of the method of operation described above where the clamp sensor 2 is held with one hand with five fingers on both operating arms 21 and 22, it is also possible to hold the clamp sensor 2 with both operating arms 21 and 22 pinched between the thumb and index finger (or between the thumb and the index finger and middle finger). Here, on the clamp sensor 2 according to the present embodiment, since the distance between the outer edges E21o and E22o is sufficiently short, the clamp sensor 2 can be reliably and easily held by pinching both operating arms 21 and 22 with two or three fingers, which makes it possible to reliably and easily perform opening and closing operations of the clamp arms 11 and 12. As a result, compared to a configuration where the clamp sensor 2 is held with one hand by placing five fingers on both operating arms 21 and 22, it is possible to hold and to open and close the clamp sensor 2 in various postures without forcibly bending and stretching the wrist, elbow, or the like when clamping the clamped object X or removing the clamp sensor 2 from the clamped object X. Accordingly, even with a clamped object X positioned in a tight location or a clamped object X positioned at a high or a low location, it is possible to move the clamp sensor 2 toward and away from the clamped object X in a variety of postures, and to open and close the clamp sensor 2 in a variety of postures, which means that it is possible to reliably and easily clamp the clamp sensor 2 to and remove the clamp sensor 2 from a variety of clamped objects X.

Also, with the clamp sensor 2 according to the present embodiment, unlike a configuration where the outer edges E21o and E22o are curved in opposite directions so that center portions in the length direction of both operating arms 21 and 22 are widely separated or a configuration where the outer edges E21o and E22o are straight along the length direction of both operating arms 21 and 22, since the outer edges E21o and E22o are curved in the same direction, slipping on the operating arm where the fingers are placed on the inside of the arc shape (for the present embodiment, this corresponds to the operating arm 21) is less likely, even when the clamp sensor 2 is held with only two or three fingers. Accordingly, slipping on the operating arm where the fingers are placed on the outside of the arc shape (for the present embodiment, this corresponds to the operating arm 22) is also less likely. As a result, the clamp sensor 2 can be reliably held with only two or three fingers, which makes it possible to favorably prevent the clamp sensor 2 from being unintentionally dropped.

As described above, the clamp sensor 2 is configured so as to include a pair of operating arms 21 and 22 that extend on the ends 11b and 12b of both clamp arms 11 and 12 and that rotate about the rotational shaft 30 so as to approach each other, thereby causing both clamp arms 11 and 12 to shift to the open state where the ends 11a and 12a of both clamp arms 11 and 12 are separated. When looking along the axial direction of the rotational shaft 30, both operating arms 21 and 22 are formed in arc shapes so that the outer edge E21o on the opposite side of the operating arm 21 to the operating arm 22 side and the outer edge E22o of the operating arm 22 on the opposite side to the operating arm 21 side are both curved in the same direction. The measuring device 1 includes the clamp sensor 2 described above and also the measuring device main body 3.

With the clamp sensor 2 and the measuring device 1 according to the present invention, since it is possible to sufficiently reduce the number of components in the clamp sensor 2 by integrally forming the clamp arm 11 and the operating arm 21 and integrally forming the clamp arm 12 and the operating arm 22, it is possible to sufficiently reduce the manufacturing cost of the components and the assembly cost. As a result, it is possible to sufficiently reduce the manufacturing cost of the clamp sensor 2. In addition, since the outer edge E21o of the operating arm 21 and the outer edge E22o of the operating arm 22 are arc-shaped and curved in the same direction, when the clamp sensor 2 is held with one hand (as one example, with all five fingers), it is possible to place the fingers on the outer edges E21o and E22o with a natural posture. As a result, the clamp sensor 2 can be held reliably and easily, which makes it possible to prevent the clamp sensor 2 from being unintentionally dropped. Also, since the fingers are favorably prevented from slipping on the outer edges E21o and E22o even when both operating arms 21 and 22 are operated, it is possible to perform opening and closing operations of both clamp arms 11 and 12 reliably and easily. In addition, when both operating arms have been brought close to each other to shift both clamp arms into the open state, the distance between the outer edges E21o and E22o is sufficiently short across the entire length direction of both operating arms 21 and 22, which makes it possible to maintain the state where both operating arms 21 and 22 are held close to each other (that is, the open state of both clamp arms 11 and 12) reliably and easily, even with a small hand. As a result, clamping of the clamped object X (that is, the attachment of the clamp sensor 2 to the clamped object) and removal of the clamp sensor 2 from the clamped object X can be performed reliably and easily. Since the distance between the outer edges E21o and E22o is sufficiently short, it is possible to hold the clamp sensor 2 reliably and easily by pinching both operating arms 21 and 22 between the thumb and the index finger (or between the thumb and the index finger and middle finger) and possible to open and close the clamp arms 11 and 12 reliably and easily in this state. Compared to the case where the clamp sensor 2 is held with one hand by placing all five fingers on both operating arms 21 and 22, it is possible to hold and to open and close the clamp sensor 2 in a variety of postures without forcibly bending and stretching the wrist or the elbow when clamping the clamped object X or removing the clamp sensor 2 from the clamped object X. Accordingly, it is possible to reliably and easily attach and remove the clamp sensor 2 even with a clamped object X that is positioned in a tight location or a clamped object X positioned at a high or a low location. Also, unlike a configuration where the outer edges E21o and E22o are curved in opposite directions so that center portions in the length direction of both operating arms 21 and 22 are widely separated or a configuration where the outer edges E21o and E22o are straight along the length direction of both operating arms 21 and 22, since the outer edges E21o and E22o are arc-shaped so as to be curved in the same direction, slipping on the operating arm where the fingers are placed on the inside of the arc shape (for the present embodiment, this corresponds to the operating arm 21) is less likely, even when the clamp sensor 2 is held with only two or three fingers. As a result, slipping on the operating arm where the fingers are placed on the outside of the arc shape (for the present embodiment, this corresponds to the operating arm 22) is also less likely. This means that the clamp sensor 2 can be reliably held with only two or three fingers, which makes it possible to favorably prevent the clamp sensor 2 from being unintentionally dropped.

Also, with the clamp sensor 2 and the measuring device 1 according to the present embodiment, by forming both operating arms 21 and 22 so that the "first distance" (the distance L21 in FIG. 7) between the rotational shaft 30 and the end 21b of the operating arm 21 on the opposite side to the clamp arm 11 side is shorter than the "second distance" (the distance L22) between the rotational shaft 30 and the end 22b of the operating arm 22 on the opposite side to the clamp arm 12 side, it is possible, when holding the clamp sensor 2 in one hand in a state where the index finger, the middle finger, the ring finger, and the little finger have been placed on the outer edge E22o of the operating arm 22, to place the thumb at the end 21b side of the outer edge E21o of the operating arm 21 with a natural posture. As a result, it is possible to perform opening and closing operations of both clamp arms 11 and 12 even more reliably and easily.

According to the clamp sensor 2 and the measuring device 1, both operating arms 21 and 22 are formed so that when looking along the axial direction, the outer edge E21o and the outer edge E22o are arc-shaped and curved in a direction from the operating arm 21 toward the operating arm 22. This means that when the clamp sensor 2 is held with one hand, the thumb can be placed with a natural posture on the outer edge E21o of the operating arm 21 and the index finger, the middle finger, the ring finger and the little finger can be placed with a natural posture on the outer edge E22o of the operating arm 22. As a result, it is possible to perform opening and closing operations of both clamp arms 11 and 12 even more reliably and easily.

According to the clamp sensor 2 and the measuring device 1, by having the signal cable 40 for connecting the clamp sensor 2 to the measuring device main body 3 (that is, the periphery) exit from the end 22b of the operating arm 22 on the opposite side to the clamp arm 12 side, unlike a configuration where the signal cable 40 exits the end 21b of the shorter operating arm 21, the signal cable 40 that exits the end 22b of the longer operating arm 22 does not obstruct operations of both operating arms 21 and 22, which makes it possible to perform opening and closing operations of both clamp arms 11 and 12 even more reliably and easily.

According to the clamp sensor 2 and the measuring device 1, by forming both operating arms 21 and 22 so that when looking along the axial direction, both the outer edge E21i on the operating arm 22 side of the operating arm 21 and the outer edge E22i on the operating arm 21 side of the operating arm 22 have arc shapes that are curved in the same direction as the outer edge E21o and the outer edge E22o, it is possible to make the width between the outer edges E21o and E21i sufficiently large across the entire length direction of the operating arm 21, possible to make the width between the outer edges E22o and E22i sufficiently large across the entire length direction of the operating arm 22, and possible to provide the clamp sensor 2 with superior aesthetics where all of the outer edges E21o, E21i, E22o, and E22i are curved in the same direction.

According to the clamp sensor 2 and the measuring device 1, by forming both operating arms 21 and 22 so that when looking along the axial direction, the part of the outer edge E21i that faces the outer edge E22i and the part of the outer edge E22i that faces the outer edge E21i have the same shape, when both operating arms 21 and 22 have been operated in a direction that brings the operating arms 21 and 22 closer to each other, a state is produced where both operating arms 21 and 22 make contact over a sufficiently wide area of the outer edges E21i and E22i. This means that even when an excessively strong force is applied, it is possible to favorably avoid breakage and deformation of both operating arms 21 and 22 and the rotational shaft 30.

Note that the configurations of the "clamp sensor" and the "measuring device" according to the present invention are not limited to the example configurations of the clamp sensor 2 and the measuring device 1 described above.

As one example, although the configuration of the clamp sensor 2 where both operating arms 21 and 22 are formed so that when looking along the axial direction of the rotational shaft 30, the outer edges E21i and E22i of the operating arms 21 and 22 have arc shapes so as to be curved in the same direction as the outer edges E21o and E22o has been described as an example, it is also possible for one or both of the "third outer edge" and the "fourth outer edge" to have an arc shape that is curved in the opposite direction to the "first outer edge" and the "second outer edge" or to have a non-curved shape (that is, to be straight, angled, or the like) (not illustrated).

Also, although the configuration of the clamp sensor 2 where both operating arms 21 and 22 are formed so that the distance L21 between the end 21b of the operating arm 21 and the rotational shaft 30 is shorter than the distance L22 between the end 22b of the operating arm 22 and the rotational shaft 30 has been described as an example, it is also possible to form both "operating arms" so that a "first distance" for "the one operating arm" and a "second distance" for "the other operating arm" are equal (not illustrated). Also, although the configuration of the clamp sensor 2 equipped with the rotation restricting member 23 that is capable of restricting operations in a direction where both operating arms 21 and 22 approach each other has been described as an example, it is also possible to configure a "clamp sensor" that is not equipped with a "rotation restricting member 23".

In addition, although an example usage where the signal cable 40 is connected to the measuring device main body 3 as the "periphery" for the present invention has been described, it is also possible to connect the signal cable 40 with an extension cable, a signal amplifier, a noise filter, or the like as the "periphery". In addition, although configurations of the measuring device 1 and the clamp sensor 2 that are capable of measuring the current value of a current flowing in the clamped object X as the "measured value" have been described as an example, it is also possible to use the same configurations as the measuring device 1 and the clamp sensor 2 described above for a "measuring device" and a "clamp sensor" that are capable of measuring electrical parameters aside from a current value as the "measured value".

What is claimed is:

1. A clamp sensor comprising:
a pair of clamp arms that are formed in arc shapes and construct a ring-shaped sensor in a closed state where front ends of the clamp arms contact each other, wherein the clamp arms are each rotatable about a rotational shaft provided in a vicinity of a base end of each clamp arm so that the front ends come in to contact and move apart; and
a pair of operating arms that extend from the base ends of both clamp arms and are capable, by rotating about the rotational shaft so as to approach each other, of shifting both clamp arms into an open state where the front ends are separated,
wherein both operating arms are formed in arc shapes where, when looking along an axial direction of the rotational shaft, a first outer edge on an opposite side of one operating arm out of the operating arms to another operating arm-side of the one operating arm and a second outer edge of the other operating arm on an opposite side to the one operating arm-side of the other operating arm are curved in a same direction.

2. The clamp sensor according to claim 1,
wherein both operating arms are formed so that a first distance between the rotational shaft and an end of the one operating arm on an opposite side to a clamp arm-side of the one operating arm is shorter than a second distance between the rotational shaft and an end of the other operating arm on an opposite side to a clamp arm-side of the other operating arm.

3. The clamp sensor according to claim 2,
wherein both operating arms are formed in arc shapes where, when looking along the axial direction, the first edge and the second edge are curved in a direction from the one operating arm toward the other operating arm.

4. The clamp sensor according to claim 3,
wherein a connecting cable for connecting the clamp sensor to a periphery exits the end of the other operating arm on the opposite side to the clamp arm-side.

5. The clamp sensor according to claim 4,
wherein both operating arms are formed in arc shapes where, when looking along the axial direction, both a third outer edge on the other operating arm -side of the one operating arm and a fourth outer edge on the one operating arm-side of the other operating arm are curved in a same direction as the first outer edge and the second outer edge.

6. The clamp sensor according to claim 5,
wherein both operating arms are formed so that when looking along the axial direction, a part of the third outer edge facing the fourth outer edge and a part of the fourth outer edge facing the third outer edge have a same shape.

7. A measuring device comprising:
the clamp sensor according to claim 5; and
a meter, connected to the connecting cable, that measures a measured value for a clamped object clamped by the clamp sensor.

8. The clamp sensor according to claim 2,
wherein both operating arms are formed in arc shapes where, when looking along the axial direction, both a third outer edge on the other operating arm-side of the one operating arm and a fourth outer edge on the one operating arm-side of the other operating arm are curved in a same direction as the first outer edge and the second outer edge.

9. The clamp sensor according to claim 8,
wherein both operating arms are formed so that when looking along the axial direction, a part of the third outer edge facing the fourth outer edge and a part of the fourth outer edge facing the third outer edge have a same shape.

10. The clamp sensor according to claim 3,
wherein both operating arms are formed in arc shapes where, when looking along the axial direction, both a third outer edge on the other operating arm-side of the one operating arm and a fourth outer edge on the one operating arm-side of the other operating arm are curved in a same direction as the first outer edge and the second outer edge.

11. The clamp sensor according to claim 10,
wherein both operating arms are formed so that when looking along the axial direction, a part of the third outer edge facing the fourth outer edge and a part of the fourth outer edge facing the third outer edge have a same shape.

12. A measuring device comprising:
the clamp sensor according to claim 3; and
a meter, connected to a connecting cable connected to the clamp sensor, that measures a measured value for a clamped object clamped by the clamp sensor.

13. The clamp sensor according to claim 2,
wherein a connecting cable for connecting the clamp sensor to a periphery exits the end of the other operating arm on the opposite side to the clamp arm-side.

14. The clamp sensor according to claim 13,
wherein both operating arms are formed in arc shapes where, when looking along the axial direction, both a third outer edge on the other operating arm-side of the one operating arm and a fourth outer edge on the one operating arm-side of the other operating arm are curved in a same direction as the first outer edge and the second outer edge.

15. The clamp sensor according to claim 14,
wherein both operating arms are formed so that when looking along the axial direction, a part of the third outer edge facing the fourth outer edge and a part of the fourth outer edge facing the third outer edge have a same shape.

16. A measuring device comprising:
the clamp sensor according to claim 4; and
a meter, connected to the connecting cable, that measures a measured value for a clamped object clamped by the clamp sensor.

17. A measuring device comprising:
the clamp sensor according to claim 2; and
a meter, connected to a connecting cable connected to the clamp sensor, that measures a measured value for a clamped object clamped by the clamp sensor.

18. The clamp sensor according to claim 1,
wherein both operating arms are formed in arc shapes where, when looking along the axial direction, both a third outer edge on the other operating arm-side of the one operating arm and a fourth outer edge on the one operating arm-side of the other operating arm are curved in a same direction as the first outer edge and the second outer edge.

19. The clamp sensor according to claim 18,
wherein both operating arms are formed so that when looking along the axial direction, a part of the third outer edge facing the fourth outer edge and a part of the fourth outer edge facing the third outer edge have a same shape.

20. A measuring device comprising:
the clamp sensor according to claim 1; and
a meter, connected to a connecting cable connected to the clamp sensor, that measures a measured value for a clamped object clamped by the clamp sensor.

* * * * *